(12) United States Patent
Park et al.

(10) Patent No.: US 8,120,436 B2
(45) Date of Patent: Feb. 21, 2012

(54) SYSTEM AND METHOD FOR IMPLEMENTING AN OSCILLATOR

(75) Inventors: Sang Wook Park, College Station, TX (US); Edgar Sánchez-Sinencio, College Station, TX (US)

(73) Assignee: The Texas A&M University System, College Station, TX (US)

( * ) Notice: Subject to any disclaimer, the term of this patent is extended or adjusted under 35 U.S.C. 154(b) by 210 days.

(21) Appl. No.: 12/433,336

(22) Filed: Apr. 30, 2009

(65) Prior Publication Data

US 2010/0231311 A1    Sep. 16, 2010

Related U.S. Application Data

(60) Provisional application No. 61/159,378, filed on Mar. 11, 2009.

(51) Int. Cl.
*H03B 5/24* (2006.01)
(52) U.S. Cl. .................... 331/140; 331/137; 331/17
(58) Field of Classification Search .............. 331/16, 331/17, 44, 137, 140
See application file for complete search history.

(56) References Cited

U.S. PATENT DOCUMENTS

| | | | |
|---|---|---|---|
| 2,268,872 A | 1/1942 | Hewlett | |
| 3,146,407 A * | 8/1964 | Crist | 331/136 |
| 7,498,893 B2 * | 3/2009 | Koellmann | 331/158 |
| 7,944,217 B2 * | 5/2011 | Lin | 324/681 |

OTHER PUBLICATIONS

Angel Rodríguez-Vázquez, et al., "*On the Design of Voltage-Controlled Sinusoidal Oscillators Using OTS's*", IEEE Transactions on Circuits and Systems, vol. 37, No. 2, pp. 198-211, Feb. 1990.
Bernabé Linares-Barranco, et al., "*CMOS OTA-C High-Frequency Sinusoidal Oscillators*", IEEE Journal of Solid-State Circuits, vol. 26, No. 2, pp. 160-165, Feb. 1991.
B. Linares-Barranco, et al., "*Generation, design and tuning of OTA-C high frequency sinusoidal oscillators*", IEE Proceedings-G, vol. 139, No. 5, pp. 557-568, Oct. 1992.
Muhammad Taher Abuelma' Atti and Muhammad Haroon Khan, "*Grounded Capacitor Oscillators Using A Single Operational Transconductance Amplifier*", Active and Passive Elec. Comp., vol. 19, pp. 91-98, 1996.
Seema Butala Anand and Behzad Razavi, "*A CMOS Clock Recovery Circuit for 2.5-Gb/s NRZ Data*", IEEE Journal of Solid-State Circuits, vol. 36, No. 3, pp. 432-439, Mar. 2001.

* cited by examiner

*Primary Examiner* — Robert Pascal
*Assistant Examiner* — James E Goodley
(74) *Attorney, Agent, or Firm* — Baker Botts L.L.P.

(57) ABSTRACT

In one embodiment, a system for generating an oscillating signal includes a transconductance amplifier comprising a single-ended output and a differential input. The system also includes only one feedback loop coupled to the transconductance amplifier. The feedback loop includes a low pass filter configured to receive the output of the transconductance amplifier. Also, the feedback loop includes a high pass filter configured to receive the output of the first low pass filter and output a signal to only one terminal of the differential input of the transconductance amplifier.

24 Claims, 2 Drawing Sheets

SYSTEM AND METHOD FOR IMPLEMENTING AN OSCILLATOR

RELATED APPLICATION

This application claims the benefit under 35 U.S.C. §119 (e) of U.S. Provisional Application No. 61/159,378 filed Mar. 11, 2009, entitled "System and Method for Implementing an Oscillator."

TECHNICAL FIELD

This invention relates generally to electronic circuits and more particularly to a system and method for implementing an oscillator.

BACKGROUND

Oscillators are useful in a variety of applications, such as communication. The Wien-Bridge oscillator is an implementation that has been widely used, but is limited. This oscillator operates using a voltage-mode feedback which requires an operational amplifier. The Wien-Bridge oscillator suffers from the inability to operate in high frequencies effectively because of the parasitic effects of a voltage-voltage amplifier (such as an operational amplifier).

Prior solutions have used a transconductance amplifier with multiple feedback loops with the feedback loops providing both positive and negative feedback. These suffer from certain disadvantages. Due to the multiple feedback loops, such solutions operate slowly. In addition, such solutions have a tendency to become unstable, especially when generating high frequency signals.

SUMMARY

In one embodiment, a system for generating an oscillating signal includes a fully differential transconductance amplifier. The fully differential transconductance amplifier includes a first transistor and a second transistor. The system also includes only one feedback loop coupled to each output terminal of the fully differential transconductance amplifier such that each of the first transistor and the second transistor are coupled to two capacitors. Each feedback loop comprises a low pass filter configured to receive a signal from one output terminal of the fully differential transconductance amplifier. The low pass filter includes a varactor coupled, in parallel, to a resistor. Each feedback loop also comprises a high pass filter. The high pass filter is configured to receive the output of the low pass filter and output a signal to the input of the fully differential transconductance amplifier. The high pass filter comprises a variable resistor coupled, in series, to a capacitor. The system also includes a third transistor operable to bias the fully differential transconductance amplifier. Further, the system includes a set of resistors, not comprised by the low pass or high pass filters, coupled to the fully differential transconductance amplifier operable to detect a common-mode voltage from the differential outputs of the transconductance amplifier.

In another embodiment, a system for generating an oscillating signal includes a transconductance amplifier comprising at least one output and at least one input. The system also includes only one feedback loop coupled to the transconductance amplifier. The feedback loop includes a low pass filter configured to receive the output of the transconductance amplifier. Also, the feedback loop includes a high pass filter configured to receive the output of the first low pass filter and output a signal to only one terminal of the at least one input of the transconductance amplifier.

In one embodiment, a method for generating an oscillating signal includes (a) low pass filtering an input signal to generate a low pass filtered signal. The method also includes (b) high pass filtering the low pass filtered signal to generate a high pass filtered signal. In addition, the method includes (c) amplifying, by a transconductance amplifier, the high pass filtered signal to generate an amplified signal. The method also includes forming only one positive feedback loop by routing the amplified signal such that the input signal of step (a) comprises the amplified signal and repeating steps (a) through (c).

Depending on the specific features implemented, particular embodiments may exhibit some, none, or all of the following technical advantages. High frequency oscillating signals may be generated using passive components. The oscillator may be implemented in a relatively small portion of a semiconductor substrate. Other technical advantages will be readily apparent to one skilled in the art from the following figures, description and claims.

BRIEF DESCRIPTION OF THE DRAWINGS

Reference is now made to the following description taken in conjunction with the accompanying drawings, wherein like reference numbers represent like parts and which.

DETAILED DESCRIPTION

Figure 1A:
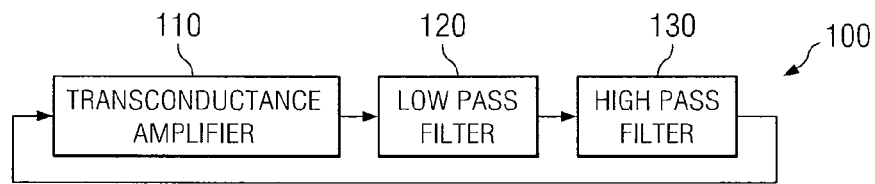
FIG. 1A illustrates a block diagram of one embodiment of an oscillator.

FIG. 1A illustrates a block diagram of one embodiment of oscillator 100. Oscillator 100 includes transconductance amplifier 110. Transconductance amplifier 110 is coupled to low pass filter 120 such that the output of transconductance amplifier 110 is received by the input of low pass filter 120. The output of low pass filter 120 is coupled to the input of high pass filter 130. The output of high pass filter 130 is coupled to the input of transconductance amplifier 110 forming a feedback loop.

In some embodiments, transconductance amplifier 110 operates in a current mode. Transconductance amplifier 110 may receive a voltage signal, amplify the signal, and output a current proportional to the received voltage signal. In various embodiments, utilizing transconductance amplifier 110 may allow for amplifying signals at high frequencies, such as those in the gigahertz range.

In some embodiments, low pass filter 120 and high pass filter 130 may include a variety of active and/or passive components. Examples of passive components may include capacitors, varactors, resistors, and variable resistors. Filters 120 and 130 also may be implemented using active components by being configured according to Sallen-Key or Multiple Feedback topologies.

Figure 1B:
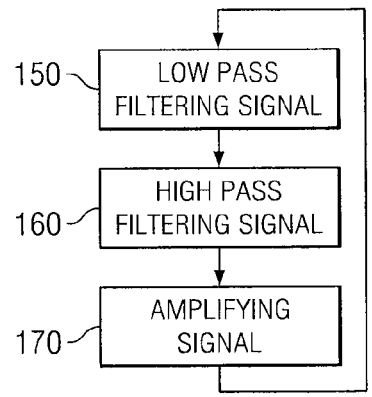
FIG. 1B is a flowchart illustrating one embodiment of the operation of the oscillator of FIG. 1A.

FIG. 1B is a flowchart illustrating one embodiment of the operation of oscillator 100 of FIG. 1A. In general, the steps illustrated in FIG. 1B may be combined, modified, or deleted where appropriate, and additional steps may also be added to the example operation. Furthermore, the described steps may be performed in any suitable order.

At step 150, a signal is filtered using low pass filter 120. The signal may be noise resident in the circuit or a signal injected into the oscillator depicted in FIG. 1A. At step 160, the output of step 150 is filtered using high pass filter 130. This may occur in order to isolate a desired frequency in the signal. At step 170, the output of step 160 is amplified using transconductance amplifier 110; the amplified signal is then filtered using low pass filter 120 at step 150. This completes the positive feedback loop and the output of step 160 may continue to be filtered and amplified by repeating steps 150-170. In some embodiments, as the positive feedback loop continues to operate, the signal measured at the input to the transconductance amplifier continues to grow until it reaches a steady state, thereby generating an oscillating signal of a desired frequency. The desired frequency of oscillator 100 may be designated by adjusting the characteristics of filters 120 and 130. The cutoff frequencies of filters 120 and 130 may be determined such that a desired frequency band remains after a signal pass through filters 120 and 130.

Figure 2:
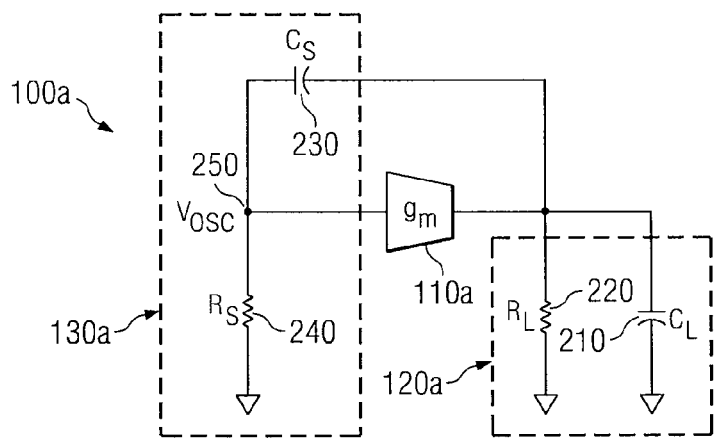
FIG. 2 is a circuit diagram illustrating one embodiment of the oscillator illustrated in FIG. 1A.

FIG. 2 is a circuit diagram illustrating one embodiment of oscillator 100a, which is a particular implementation of oscillator 100. Oscillator 100a includes transconductance amplifier 110a that is coupled to low pass filter 120a and high pass filter 130a. High pass filter 130a includes resistor 240 connected in series with capacitor 230. Low pass filter 120a includes capacitor 210 connected in parallel with resistor 220. The frequency of the signal measured at node 250 may be determined by utilizing the following formula:

$$\omega_0^2 = \frac{1}{R_S C_S R_L C_L}$$

where $R_s$ and $R_l$ are the resistances of resistors 240 and 220, respectively; where $C_s$ and $C_l$ are the capacitances of capacitors 230 and 210, respectively; and where $\omega_0^2$ is the square of the frequency of the signal measured at node 250. Thus, a desired frequency may be determined by changing the values of resistors 220 and 240 and/or capacitors 210 and 230. In some embodiments, the gain ($g_m$) of transconductance amplifier 110a may be determined utilizing the following formula:

$$g_m \geq \frac{\frac{R_S}{R_L} + \frac{C_L}{C_S} + 1}{R_S}$$

The depicted embodiment of FIG. 2 illustrates an oscillating circuit with only one feedback loop: the output of transconductance amplifier 110a is passed through capacitor 230 before reaching the input of transconductance amplifier 110a. In some embodiments, a single-ended (rather than a differential) output of the transconductance amplifier may be utilized in forming the feedback loop. In some embodiments, this architecture reduces parasitic capacitance and improves the likelihood of generating high quality high frequency signals. Such an architecture may also increase power efficiency. In some embodiments, an optimal configuration of resistor and capacitor values may be where $R_s$ is equal to $2R_l$ and $C_s$ is equal to $C_l$, respectively. In various embodiments, the architecture depicted in FIG. 2 may be implemented in a relatively small portion of a semiconductor substrate since it does not include inductors.

Low pass and high pass filters 120a and 130a are depicted as including resistors and capacitors. These components may be variable so that the filters may be tuned to desired frequencies. Examples of variable components that may be used include varactors and variable resistors. In some embodiments, other suitable components may be used to form the filters, such as active components. For example, digital filters may be utilized to form filters 120a and 130a.

Figure 3:
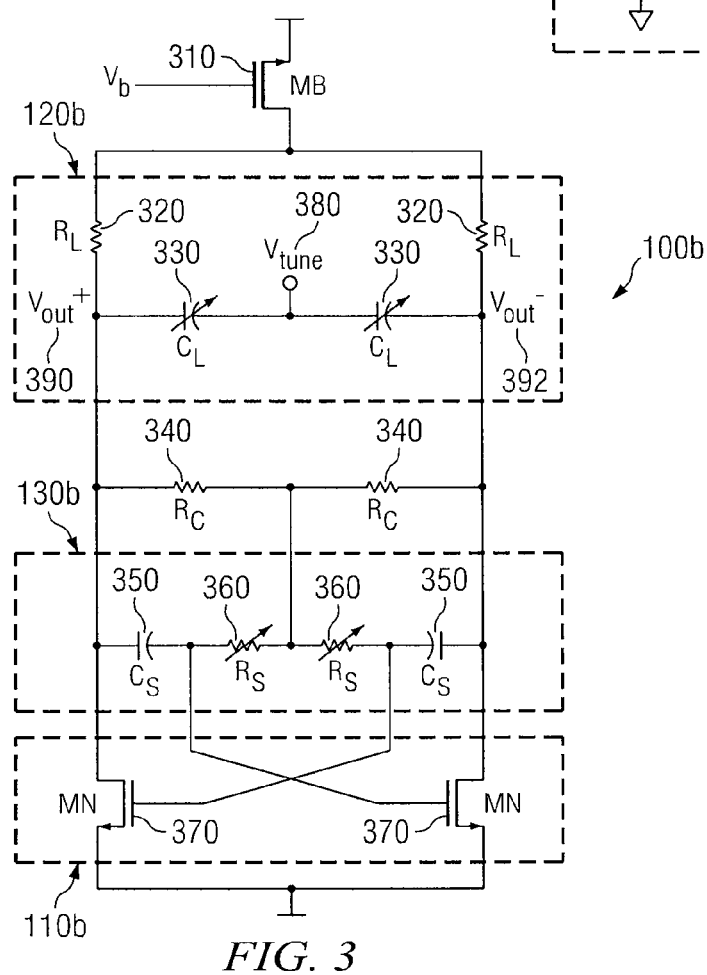
FIG. 3 illustrates a fully differential embodiment of the oscillator depicted in FIG. 1A.

FIG. 3 illustrates a fully differential embodiment of oscillator 100b, which is a particular implementation of oscillator 100. Transistor 310 is coupled to low pass filter 120b. Low pass filter 120b includes varactors 330 coupled in parallel to resistors 320. Node 380 may be used to control the capacitance of varactors 330 by applying a voltage ($V_{tune}$) to node 380. High pass filter 130b is coupled to low pass filter 120b. High pass filter 130b includes capacitors 350 coupled, in series, to variable resistors 360. High pass filter 130b is coupled to transconductance amplifier 110b which is operating in a fully differential mode. Transconductance amplifier 110b includes transistors 370. Resistors 340 are coupled to transistors 370 and operate to detect a common-mode voltage from the differential outputs and use it to bias transistors 370. Transistor 310 sets a total current with a bias voltage ($V_b$) and is used to bias transistors 370. Transistor 310 may also provide a shielding effect from power supply noise.

In operation, when transistor 310 is activated, any difference between nodes 390 and 392 (which could arise due to noise or mismatch) is detected, filtered (utilizing low pass filter 120b and high pass filter 130b), and amplified (utilizing transconductance amplifier 110b). Since the outputs of transistors 370 are routed to capacitors 350 and capacitors 350 are coupled to the input of transistors 370, positive feedback loops are formed. In time, the system may reach a steady state such that an oscillating signal may be measured across nodes 390 and 392 which will have a frequency determined by low pass filter 120b and high pass filter 130b.

In some embodiments, a desired frequency band may be determined by utilizing varactors 330 and variable resistors 360. For example, the cutoff frequency of high pass filter 130b may be determined by manipulating the resistance of variable resistors 360. The cutoff frequency of low pass filter 120b may be determined by changing the voltage level at $V_{tune}$ such that the capacitance across varactors 330 is changed. As described above, changing the cutoff frequencies of filters 120b and 130b may allow control over what frequencies are present in the signal outputted by oscillator 100b.

The depicted embodiment of FIG. 3 illustrates a positive feedback loop for each of the outputs of transconductance amplifier 110b. Each of these outputs are coupled to capacitors 350. In turn, capacitors 350 are coupled to the inputs of transconductance amplifier 110b, forming positive feedback loops. In some embodiments, this may be advantageous in that it allows the circuit to reliably generate high frequency oscillating signals. In various embodiments, the architecture depicted in FIG. 3 may be implemented in a relatively small portion of a semiconductor substrate since it does not include inductors.

In some embodiments, varactors 330 may include varactor diodes. Varactors 330 may also be implemented using active components. Other suitable components may be used. In various embodiments, varactors 330 may be substituted with capacitors that have fixed capacitances.

In some embodiments, variable resistors 360 may comprise a digital resistor bank. They may also comprise potentiometers. Other suitable components may be used. In various embodiments, variable resistors 360 may be substituted with resistors with fixed resistances.

In some embodiments, transistor 310 may be n-type while transistor 370 may be p-type. Transistor 310 may be p-type while transistor 370 may be n-type. Transistors 310 and 370 may use MOSFET, JFET, or other suitable semiconductor technologies.

Figure 4:
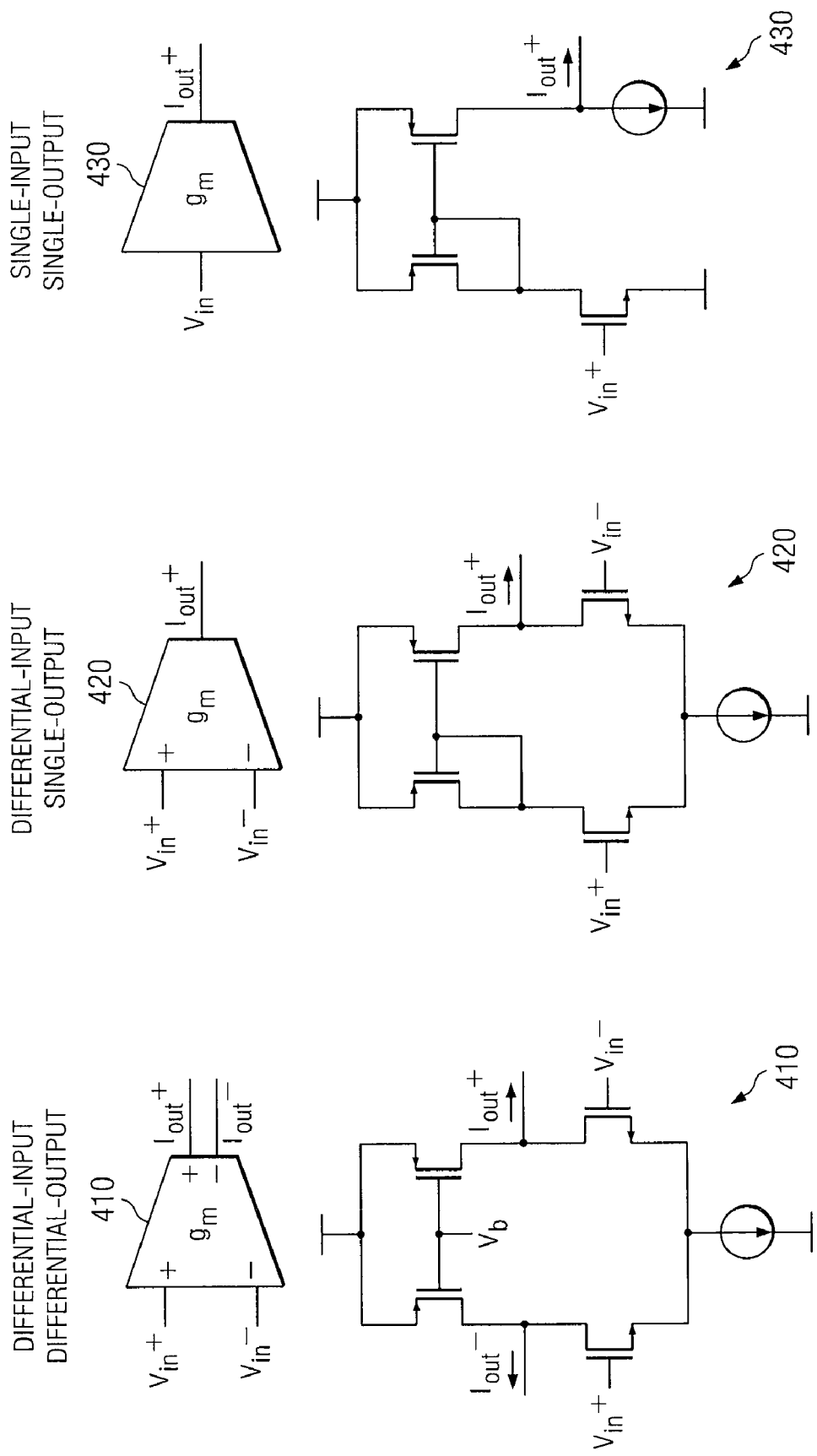
FIG. 4 illustrates various embodiments of a transconductance amplifier.

FIG. 4 illustrates several embodiments of transconductance amplifiers that may be used in the oscillators described above. Amplifier 410 is an embodiment of a differential-input, differential-output transconductance amplifier. Amplifier 420 is an embodiment of a differential-input, single-output transconductance amplifier. Amplifier 430 is an embodiment of a single-input, single-output transconductance amplifier. Amplifiers 410-430 provide examples of transconductance amplifiers that may be used with the oscillators described in FIGS. 1-3. Other suitable configurations of a transconductance amplifier may be utilized in the oscillators described above.

Although several embodiments have been illustrated and described in detail, it will be recognized that modifications and substitutions are possible without departing from the spirit and scope of the appended claims.

What is claimed is:

1. A system for generating an oscillating signal, the system comprising:
a fully differential transconductance amplifier comprising a first transistor and a second transistor;
only one feedback loop coupled to each output terminal of the fully differential transconductance amplifier such that each of the first transistor and the second transistor are coupled to two capacitors, the feedback loop comprising:
a low pass filter configured to receive a signal from one output terminal of the fully differential transconductance amplifier, wherein the low pass filter comprises a varactor coupled, in parallel, to a resistor; and
a high pass filter configured to:
receive the output of the low pass filter; and
output a signal to the input of the fully differential transconductance amplifier;
wherein the high pass filter comprises a variable resistor coupled, in series, to a capacitor;
a third transistor operable to bias the fully differential transconductance amplifier;
a set of resistors, not comprised by the low pass or high pass filters, coupled to the fully differential transconductance amplifier operable to detect a common-mode voltage from the differential outputs of the transconductance amplifier.

2. A system for generating an oscillating signal, the system comprising:
a transconductance amplifier comprising at least one output and at least one input;
only one feedback loop coupled to the transconductance amplifier, the feedback loop comprising:
a first low pass filter configured to receive the at least one output of the transconductance amplifier; and
a first high pass filter configured to:
receive the output of the first low pass filter; and
output a signal to only one terminal of the at least one input of the transconductance amplifier; and
wherein the system is devoid of an inductor and devoid of an oscillating crystal.

3. The system of claim 2, wherein the low pass filter comprises a varactor such that the low pass filter is tunable.

4. The system of claim 2, wherein the high pass filter comprises a variable resistor such that the high pass filter is tunable.

5. The system of claim 4, wherein the variable resistor comprises a digital resistor bank.

6. The system of claim 2, wherein the output of the transconductance amplifier is coupled to a capacitor.

7. The system of claim 2, wherein the low pass filter comprises a resistor and a capacitor.

8. The system of claim 2, wherein the high pass filter comprises a resistor and a capacitor.

9. The system of claim 2, wherein the at least one input of the transconductance amplifier comprises grounding one input of the at least one input.

10. A system for generating an oscillating signal, the system comprising:
a fully differential transconductance amplifier;
only one feedback loop coupled to each output terminal of the fully differential transconductance amplifier, the feedback loop comprising:
a low pass filter configured to receive a signal from one output terminal of the fully differential transconductance amplifier; and
a high pass filter configured to:
receive the output of the low pass filter; and
output a signal to the input of the fully differential transconductance amplifier; and
wherein the system is devoid of an inductor and devoid of an oscillating crystal.

11. The system of claim 10, wherein the low pass filter comprises a varactor coupled, in parallel, to a resistor.

12. The system of claim 10, wherein the high pass filter comprises a variable resistor coupled, in series, to a capacitor.

13. The system of claim 12, wherein the variable resistor comprises a digital resistor bank.

14. The system of claim 10, wherein each output of the fully differential transconductance amplifier is coupled to a capacitor.

15. The system of claim 10, wherein the fully differential transconductance amplifier comprises two transistors, wherein the transistors are each coupled to two capacitors.

16. The system of claim 10, further comprising:
a transistor operable to bias the fully differential transconductance amplifier; and
two resistors coupled to the fully differential transconductance amplifier operable to detect a common-mode voltage from the differential outputs of the transconductance amplifier.

17. A method for generating an oscillating signal, the method comprising:
(a) low pass filtering an input signal to generate a low pass filtered signal;
(b) high pass filtering the low pass filtered signal to generate a high pass filtered signal;
(c) amplifying, by a transconductance amplifier, the high pass filtered signal to generate an amplified signal;
(d) forming only one positive feedback loop by routing the amplified signal such that the input signal of step (a) comprises the amplified signal and repeating steps (a) through (c);
wherein the method is devoid of using an inductor on the input signal, the low pass filtered signal, the high pass filtered signal, and the amplified signal; and
wherein the method is devoid of using an oscillating crystal on the input signal, the low pass filtered signal, the high pass filtered signal, and the amplified signal.

18. The method of claim 16, wherein low pass filtering the input signal comprises utilizing a varactor such that the low pass filtering is tunable.

19. The method of claim 16, wherein high pass filtering the low pass filtered signal comprises utilizing a variable resistor such that the high pass filtering is tunable.

20. A method for generating an oscillating signal, the method comprising:
- (a) low pass filtering differential input signals to generate low pass filtered differential signals;
- (b) high pass filtering the low pass filtered differential signals to generate high pass filtered differential signals;
- (c) amplifying, by a fully differential transconductance amplifier, the high pass filtered differential signals to generate amplified differential signals;
- (d) forming only two positive feedback loops by routing the differential amplified signals such that the differential input signals of step (a) comprises the differential amplified signals and repeating steps (a) through (c);

wherein the method is devoid of using an inductor on the differential input signals, the low pass filtered differential signals, the high pass filtered differential signals, and the differential amplified signals; and wherein the method is devoid of using an oscillating crystal on the differential input signals, the low pass filtered differential signals, the high pass filtered differential signals, and the differential amplified signals.

21. The method of claim 19, wherein low pass filtering the differential input signals comprises utilizing a varactor such that the low pass filtering is tunable.

22. The method of claim 19, wherein high pass filtering the low pass filtered differential signals comprises utilizing a variable resistor such that the high pass filtering is tunable.

23. The method of claim 19, wherein the fully differential transconductance amplifier comprises two transistors each coupled to two capacitors.

24. The system of claim 1, wherein the only one feedback loop is devoid of an inductor.

* * * * *